(12) United States Patent
Shin

(10) Patent No.: US 7,371,655 B2
(45) Date of Patent: May 13, 2008

(54) METHOD OF FABRICATING LOW-POWER CMOS DEVICE

(75) Inventor: Eun Jong Shin, Seoul (KR)

(73) Assignee: Dongbu Electronics Co., Ltd, Seoul (KR)

( * ) Notice: Subject to any disclaimer, the term of this patent is extended or adjusted under 35 U.S.C. 154(b) by 58 days.

(21) Appl. No.: 11/318,433

(22) Filed: Dec. 28, 2005

(65) Prior Publication Data

US 2006/0141727 A1 Jun. 29, 2006

(30) Foreign Application Priority Data

Dec. 29, 2004 (KR) ............... 10-2004-0114688

(51) Int. Cl.
*H01L 21/76* (2006.01)
(52) U.S. Cl. ............ 438/427; 438/424; 438/401; 438/430; 438/431; 438/432; 257/E21.549; 257/E21.547; 257/E21.572
(58) Field of Classification Search ......... 438/427, 438/424, 401, 430, 431, 432; 257/E21.549, 257/E21.547, E21.572
See application file for complete search history.

(56) References Cited

U.S. PATENT DOCUMENTS

| | | | | | |
|---|---|---|---|---|---|
| 5,895,253 | A | * | 4/1999 | Akram | 438/424 |
| 5,920,786 | A | * | 7/1999 | Pham et al. | 438/424 |
| 5,945,352 | A | * | 8/1999 | Chen et al. | 438/713 |
| 5,998,279 | A | * | 12/1999 | Liaw | 438/424 |
| 6,107,159 | A | * | 8/2000 | Chuang | 438/432 |
| 6,187,649 | B1 | * | 2/2001 | Gau | 438/424 |
| 6,214,670 | B1 | * | 4/2001 | Shih et al. | 438/259 |
| 2003/0100168 | A1 | * | 5/2003 | Lee et al. | 438/424 |
| 2005/0054131 | A1 | * | 3/2005 | Wada et al. | 438/31 |
| 2005/0176214 | A1 | * | 8/2005 | Chang et al. | 438/424 |
| 2005/0191800 | A1 | * | 9/2005 | Wu et al. | 438/197 |

* cited by examiner

*Primary Examiner*—Michael Lebentritt
*Assistant Examiner*—Mohsen Ahmadi
(74) *Attorney, Agent, or Firm*—McKenna Long & Aldridge LLP

(57) ABSTRACT

A low-power CMOS device can be fabricated by forming a shallow trench on a silicon substrate using a gate mask and negative photoresist. This enables an extremely low profile for a junction after completion of lightly doped drain and source/drain implantations. The method includes forming a shallow trench in a silicon substrate.

10 Claims, 3 Drawing Sheets

METHOD OF FABRICATING LOW-POWER CMOS DEVICE

CROSS-REFERENCE TO RELATED APPLICATIONS

This application claims the benefit of Korean Patent Application No. 10-2004-0114688, filed on Dec. 29, 2004, which is hereby incorporated by reference for all purposes as if fully set forth herein.

BACKGROUND OF THE INVENTION

1. Field of the Invention

The present invention relates to a method of fabricating a low-power CMOS device. Although the present invention is suitable for a wide scope of applications, it is particularly suitable for forming a shallow trench on a silicon substrate using a gate mask and negative photoresist to enable an extremely low profile for a junction after completion of lightly doped drain and source/drain implantations.

2. Discussion of the Related Art

A fabricating process of a low-power CMOS device includes depositing a gate oxide layer and polysilicon on a substrate, depositing a gate sidewall spacer layer over the substrate including the gate oxide layer and polysilicon by low-pressure chemical vapor deposition, forming a gate structure by active ion etch, performing lightly doped drain and source/drain implantations, forming a self-aligned silicide for metallization, depositing a silicon nitride (SiN) layer having a thickness of 70-100 nm by plasma deposition, and forming an interlayer dielectric and M1 contact hole. The SiN layer is deposited as a buffer layer for transistor protection over the substrate. A low-power CMOS device fabrication method according to a related art is illustrated in FIGS. 1A-1C.

FIGS. 1A and 1B show a gate pattern after deposition of a gate oxide layer 3 and a gate-doped polysilicon 4 formed 210-230 nm thick. The gate oxide layer 3, the gate-doped polysilicon layer 4, a tetra-ethyl-ortho-silicate layer 5, and a silicon nitride layer 6 are stacked on a substrate 1. A lightly doped drain (LDD) layer 2 is formed between the substrate 1 and the tetra-ethyl-ortho-silicate layer 5 by implantation.

FIG. 1B also shows a gate structure formed by reactive ion etching. A gate sidewall 5a and a spacer 6a are formed. A barrier layer 8 is formed by low-pressure chemical vapor deposition. As shown, the implantation depth of a source/drain layer 11 beneath the LDD 2 is substantial.

FIG. 1C shows an interlayer dielectric 15 and an M1 contact hole 12 after forming the LDD 2 and the source/drain layer 11 by implantation. A self-aligned silicide for metallization and a 70-100 nm thick SiN layer 8 formed by plasma deposition are shown. The SiN layer 8 is a buffer layer for transistor protection.

The considerable depth of the source/drain junction, however, causes short-channel effects and junction leakage current.

SUMMARY OF THE INVENTION

Accordingly, the present invention is directed to a method of fabricating a low-power CMOS device that may substantially obviate one or more problems due to limitations and disadvantages of the related art.

One advantage of the present invention is to provide a method of fabricating a low-power CMOS device, in which a shallow trench is formed on a silicon substrate using a gate mask and negative photoresist to enable practical processes.

Another advantage of the present invention is to provide a method of fabricating a low-power CMOS device, by which an extremely low profile for a junction is enabled after completion of lightly doped drain and source/drain implantations.

Additional features and advantages of the invention will be set forth in the description which follows, and in part will be apparent from the description, or may be learned by practice of the invention. The objectives and other advantages of the invention will be realized and attained by the method particularly pointed out in the written description and claims hereof as well as the appended drawings.

To achieve these and other advantages and in accordance with the purpose of the present invention, as embodied and broadly described, there is provided a method of fabricating a low-power CMOS device, the method comprising providing a silicon substrate; and forming a shallow trench in the silicon substrate using a gate mask and negative photoresist.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention, illustrate embodiment(s) of the invention and together with the description serve to explain the principles of the invention. In the drawings.

DETAILED DESCRIPTION OF THE INVENTION

Reference will now be made in detail to the embodiments of the present invention, examples of which are illustrated in the accompanying drawings. Wherever possible, like reference designations will be used throughout the drawings to refer to the same or similar parts.

In the method of fabricating a low-power CMOS device according to the present invention, the source/drain depth is considerably lowered for a junction, after completion of lightly doped drain and source/drain implantations, by preparing a shallow trench on a silicon substrate using a gate mask and negative photoresist.

Figure 1A:
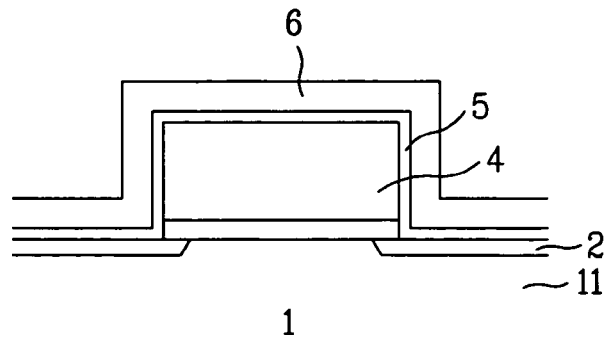
FIGS. 1A-1C are cross-sectional diagrams illustrating a low-power CMOS device fabrication method.
Figure 1B:
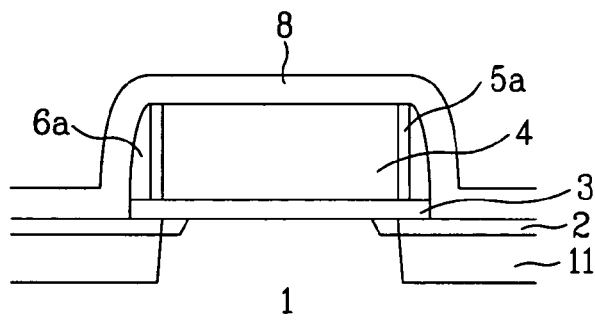
Figure 1C:
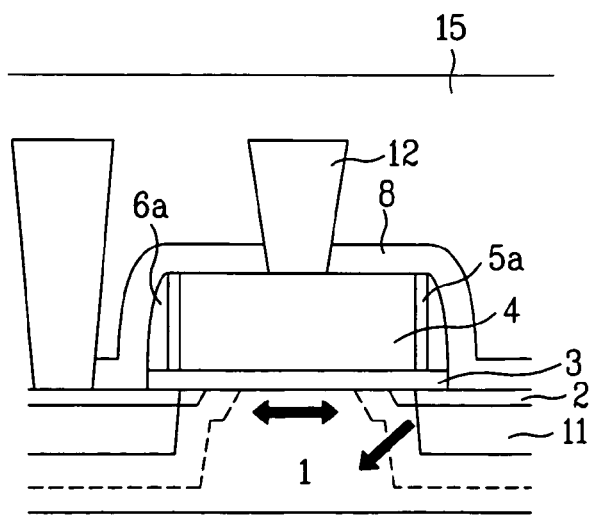
Figure 2A:
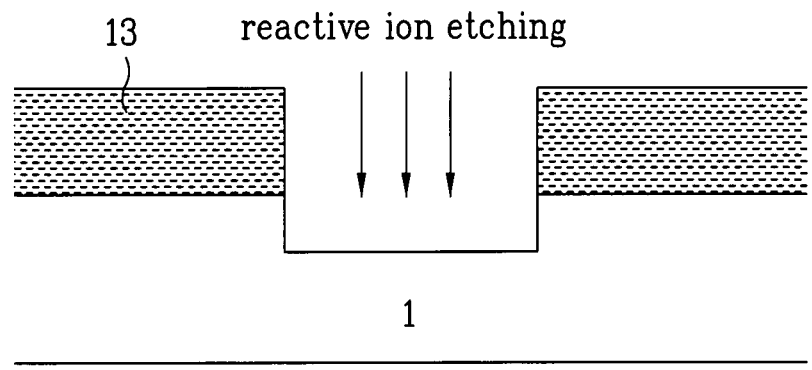
FIGS. 2A-2E are cross-sectional diagrams illustrating a method of fabricating a low-power CMOS device according to the present invention.

FIG. 2A shows a silicon substrate 1 etched by reactive ion etching to a thickness of about 50 nm with a gate mask using a negative photoresist 13 to form a shallow trench.

Figure 2B:
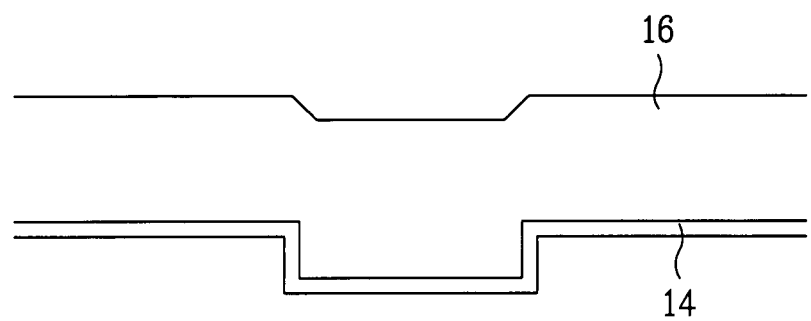

FIG. 2B shows a gate oxide layer 14, formed by a fast thermal process such as using a furnace, on the substrate 1. FIG. 2B also shows a gate polysilicon 16 on the gate oxide layer 14. The gate polysilicon 16 is formed by low-pressure chemical vapor deposition to fabricate a transistor.

Figure 2C:
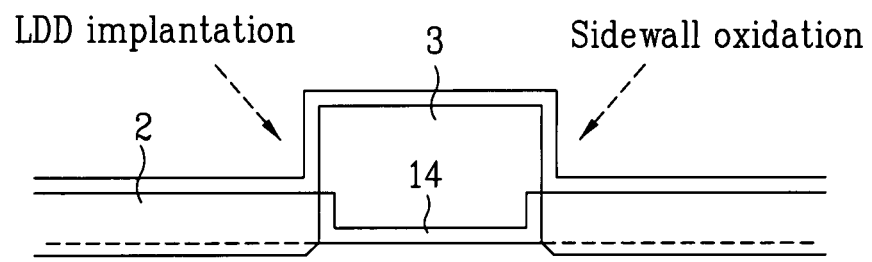

FIG. 2C shows the LDD-implanted substrate. After a gate 3 is patterned using a gate mask, the sidewall is oxidized for supplementation of an interface of the polysilicon. LDD-implantation is then carried out on the substrate 1. The implantation depth of a lightly doped drain layer 2 adjacent to the trench of the low-power CMOS device is considerably lowered as compared to the implantation depth of the related art.

Figure 2D:
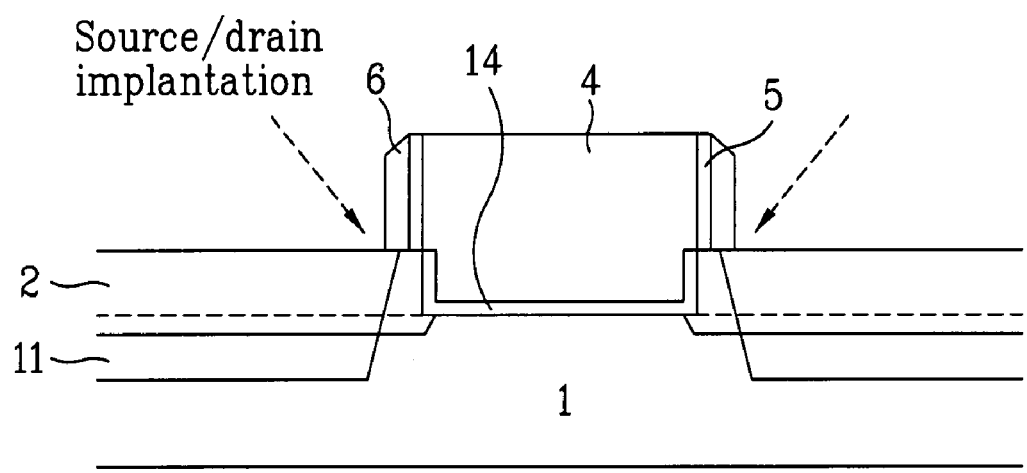

FIG. 2D shows the source/drain-implanted substrate 1 after forming spacers 5 and 6. FIG. 2D also shows gate-doped polysilicon layer 4. The implantation depth of a source/drain 11 adjacent to the trench of the low-power CMOS device is considerably lowered as compared to the implantation depth of the related art.

Figure 2E:
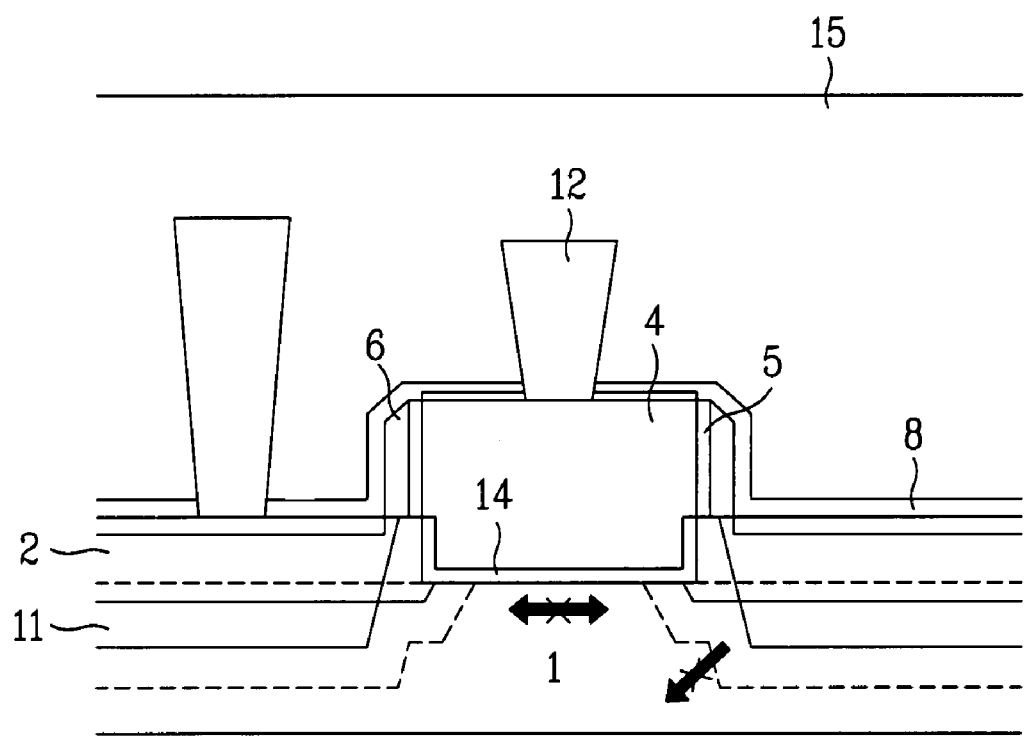

FIG. 2E shows the substrate 1 having a silicide layer 8 formed by self-aligned silicidation, an interlayer dielectric 15, and an M1 contact hole 12. By forming the shallow trench in the silicon substrate 1, a considerably shallow junction can be formed after completion of the lightly doped drain and source/drain implantations. As such, short-channel effects and junction leakage may be prevented.

Accordingly, the present invention can implement the considerably shallow junction after completion of the lightly doped drain and source/drain implantations by previously forming the shallow trench in the silicon substrate using a gate mask and negative photoresist. Thus, manufacturing costs can be reduced by processing without an additional mask, whereby practical processes are enabled.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a low-power CMOS device, comprising:
   providing a silicon substrate;
   forming forming a shallow trench in the silicon substrate using a gate mask and negative photoresist;
   forming a gate oxide layer in the shallow trench of the silicon substrate; forming a gate polysilicon layer on the gate oxide layer;
   patterning the gate polysilicon layer and the gate oxide layer using the gate mask to form a gate on the shallow trench;
   forming a lightly doped drain layer adjacent to the trench;
   oxidizing a sidewall of the gate polysilicon;
   forming a source/drain layer under the lightly doped drain layer of the silicon substrate;
   forming a silicide layer by self-aligned silicidation;
   forming an interlayer dielectric; and
   forming a contact hole.

2. The method of claim 1, wherein the shallow trench is formed by reactive ion etching.

3. The method of claim 1, further comprising forming the gate oxide layer using a furnace.

4. The method of claim 1, further comprising forming the gate polysilicon by low-pressure chemical vapor deposition to fabricate a transistor.

5. The method of claim 1, wherein an implantation depth of the lightly doped drain layer is lowered.

6. The method of claim 1, wherein an implantation depth of the source/drain layer is lowered.

7. A method of fabricating a low-power CMOS device, comprising:
   providing a silicon substrate;
   forming a shallow trench in the silicon substrate using a gate mask and negative photoresist, wherein a thickness of the silicon substrate is approximately 50 nm;
   depositing a gate oxide layer on the silicon substrate using a furnace;
   forming a lightly doped drain layer adjacent to the trench;
   forming a gate polysilicon on the gate oxide layer;
   patterning the gate oxide layer to form a gate using the gate mask oxidizing a sidewall of the gate polysilicon;
   forming a source/drain layer under the lightly doped drain layer of the silicon substrate;
   forming a silicide layer by self-aligned silicidation;
   forming an interlayer dielectric; and
   forming a contact hole.

8. The method of claim 7, wherein the shallow trench is formed by reactive ion etching.

9. The method of claim 7, wherein an implantation depth of the lightly doped drain layer is lowered.

10. The method of claim 7, wherein an implantation depth of the source/drain layer is lowered.

* * * * *